United States Patent [19]

Anzani

[11] 4,045,629
[45] Aug. 30, 1977

[54] ELECTRICAL PROXIMITY SWITCH ARRANGEMENTS

[75] Inventor: Alberto Anzani, Varese, Italy

[73] Assignee: Bassani Ticione S.p.A., Milan, Italy

[21] Appl. No.: 566,429

[22] Filed: Apr. 8, 1975

[30] Foreign Application Priority Data

Apr. 12, 1974 Italy .................................. 21362/74

[51] Int. Cl.² ...................... H01H 35/00; H01H 9/00
[52] U.S. Cl. ................................. 200/52 R; 200/293; 200/DIG. 1
[58] Field of Search ....... 200/52 R, DIG. 1, 293–296; 307/116; 317/DIG. 2, 249 R; 340/258 C, 365 C

[56] References Cited

U.S. PATENT DOCUMENTS

| | | | |
|---|---|---|---|
| 2,525,769 | 10/1950 | Bruns | 200/DIG. 1 |
| 2,659,533 | 11/1953 | Quinby et al. | 200/DIG. 1 |
| 3,281,541 | 10/1966 | Learner | 340/365 C UX |
| 3,307,071 | 2/1967 | Diamond | 200/DIG. 1 |
| 3,339,050 | 8/1967 | Mitchell | 200/295 |
| 3,492 440 | 1/1970 | Cerbone et al. | 200/DIG. 1 X |
| 3,492,440 | 1/1970 | Cerbone et al. | 200/DIG. 1 |
| 3,562,468 | 2/1971 | Stefani | 200/295 |
| 3,668,698 | 6/1972 | Demirdjioghlou et al. | 200/DIG. 1 |

OTHER PUBLICATIONS

Hoberman, Stu; *Popular Science, Electronics Section,* "Touch Module—This New Version Does Many Jobs"; pp. 124, 125; Feb. 1973.

*Primary Examiner*—James R. Scott
*Attorney, Agent, or Firm*—Michael J. Striker

[57] ABSTRACT

An arrangement for modular mounting of a plurality of proximity switches comprises a plate of insulating material having a plurality of first conductive plates mounted on its front face. A respective housing containing a switch circuit is replaceably mounted to the rear face of the plate of insulating material in correspondence with each first conductive plate. Each housing contains a second conductive plate which, in conjunction with the associated first conductive plate, forms a parallel-plate capacitor. The dielectric of the capacitor is formed by the plate of insulating material, a flat wall of the housing which the second conductive plate lines, and an air gap between the plate and the flat wall. Touching of the second plate by a user varies the capacity of the capacitor thus generating a signal operating the circuit within the housing. Since the two plates of the capacitor are mutually isolated, the user cannot experience an electric shock. The housing may be mounted in the rear face of the plate of insulating material either direct or by way of an intermediate supporting frame.

7 Claims, 4 Drawing Figures

ELECTRICAL PROXIMITY SWITCH ARRANGEMENTS

BACKGROUND OF THE INVENTION

1. Field of the Invention

The present invention relates to an electrical proximity switch arrangement and is more particularly concerned with the installation and protection of proximity switches or the like, i.e. solid state devices which are actuated by approaching or touching with the hand conductive plate so as to generate a signal which, properly amplified, will in turn provide a control signal, such as for activating or de-activating associated equipment.

2. Description of the Prior Art

Proximity switches heretofore known in the art have exhibited a number of disadvantages, both as regards installation and safety. Some of the known switches operate on the basis of the conduction of an electric current when the conductive plate is touched. As a result, there will be an electrical connection, even though through a large resistance, between the plate and the internal circuit. The said connection is attained by piercing the wall of an insulating support plate, to which the conductive plate is secured, and making a connecting conductor pass through the hole formed by the piercing operation, the conductor extending from this plate to a portion of the circuit. Such portion of the circuit is necessarily mounted on the rear face of the insulating support plate. The remaining portion of the circuit is enclosed within a separate housing which is connected to the first-mentioned portion by means of pins or coupling connectors.

The above-described prior art arrangement is complicated and expensive, and moreover presents an obstacle to modular production of the different units, along with difficulty in installation and large overall dimensions.

In addition, the said electrical connection from the conductive plate, even though through a large resistance, always results in danger to the user. The circuits are fed by the mains or network voltage so that there is always a risk that, for some incidental cause, the connecting conductor will transmit the whole voltage to the conductive plate, with serious consequences for the user.

SUMMARY OF THE INVENTION

The present invention has a main object that of overcoming the disadvantages of the prior art as recited above.

A more specific object of the invention is to provide apparatus free of any and all risk of electric shock.

A further object of the invention is to provide apparatus which is simple and cheap to construct and capable of construction in modular form, thus facilitating installation and decreasing overall dimensions.

According to the present invention, the entire circuit of the or each single proximity switch or the like is enclosed within an insulating housing which is provided with a flat wall lined internally with a conductive plate. The or each single housing is equipped with means for mounting it at a desired position at the rear face of a covering insulating plate. The or each housing is mounted in such a manner that the flat wall will be arranged facing and at a short distance from the rear face of the covering plate, the desired position being established by a second conductive plate provided on the front or outer face of the covering plate, and in such a manner the internal conductive plate of the housing and the second conductive plate will be parallel to one another, and separated by threeinsulating layers, namely by the flat wall of the housing, the covering plate and a thin air gap therebetween.

A number of advantages are provided by this arrangement.

First, the two parallel conductive plates comprise the plates of a capacitor, the dielectric of which is formed by the said three insulating layers, with the inner plate disposed internally of the housing being at the mains or network voltage, and the outer plate completely insulated from the inner one. When a user touches the outer plate a change of the capacity of the capacitor will result, independently of the manner in which the plate is touched, the change in capacity comprising a signal for controlling the proximity switch or a similar unit. In this manner, danger to the user is prevented.

Second, the housing may house the entire circuit of the unit, which will therefore be both electrically and mechanically insulated from the outer plate and the covering plate. In this manner, the units may be enclosed within insulating housings of modular dimensions which are interchangeably installable at the rear of the plate, thus facilitating installation, replacement of single units and connection.

Moreover, the overall dimensions in the case of installation of a plurality of units at a single point will permit modular execution.

The modular capability, in addition, has the advantage of facilitating installation of units which are reserved for different functions and which cooperate for the realization of an installation with a number of tasks. Finally, the modular capability will promote the development of solid state apparatuses of different natures for civil installations, without the occurrence of problems of realization or of installations.

BRIEF DESCRIPTION OF THE DRAWING

Other objects, features and advantages of this invention will appear from the folowing description of preferred but non-limiting embodiments of the invention, the description making reference to the accompanying drawing, in which.

DESCRIPTION OF THE PREFERRED EMBODIMENT

Figure 1:
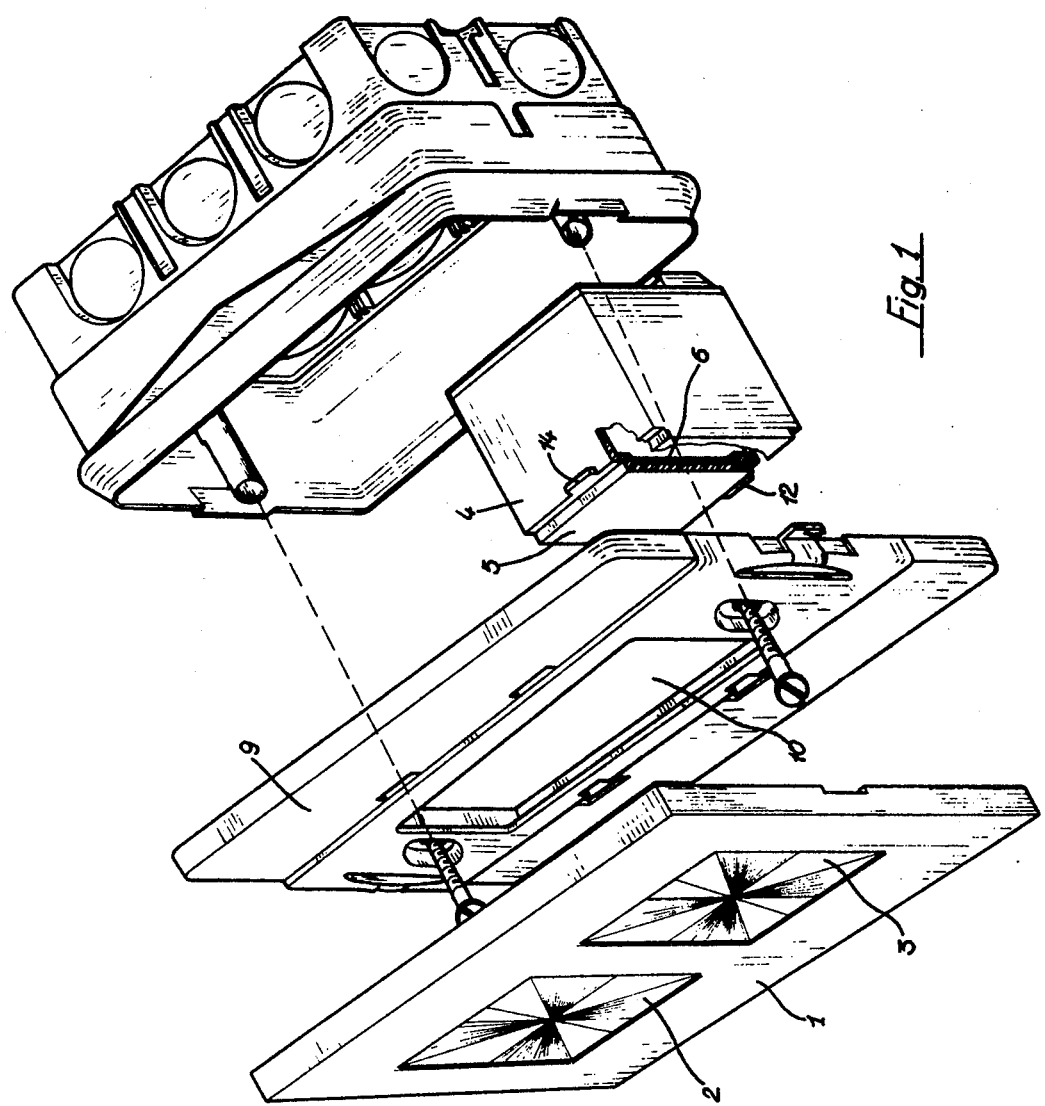
FIG. 1 is an exploded perspective view of one side of the arrangement showing different elements cooperating for the installation, a modular housing, element being shown partially in section.

Referring to the drawing, reference numeral 1 denotes a plate of insulating material which, in addition to acting as a covering means, may act also as a support, in a manner which will be described hereinbelow. The plate 1 mounts two plates 2 and 3 of conductive material, such as aluminum, the plates 2 and 3 being mounted within recesses provided on the front face of the plate 1 and having a thickness which does not noticeably reduce the thickness 7 of the plate 1. The plates 2 and 3 are spaced apart by a distance which is established according to a desired modular spacing.

Reference numeral 4 indicates a housing of an insulating material and provided for housing the entire circuit of a proximity switch or a circuit of any nature. The housing 4 has a flat wall 5 lined internally with a conductive plate 6, of dimensions approximately equal to those of the plates 2 and 3.

Figure 3:
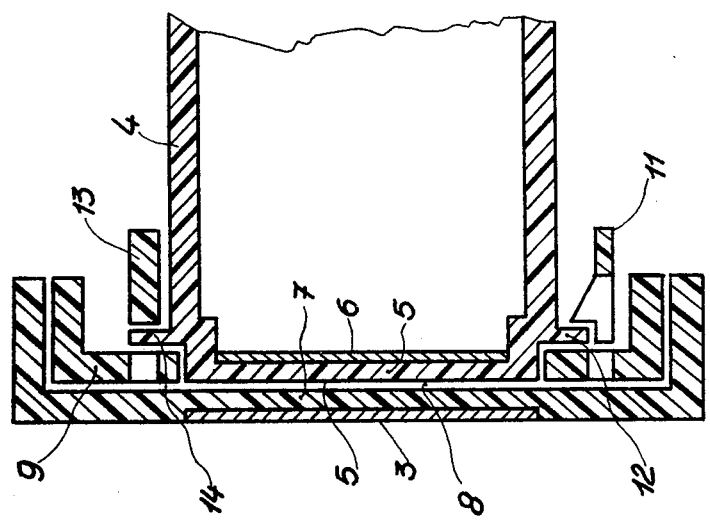
FIG. 3 is a cross-sectional view of assembled elements of the complete assembly.

The housing 4 is arranged to be mounted to the rear face of the plate 1 with the flat wall 5 facing the rear face of the plate 3, in such a manner that the conductive plates 3 and 6 will be parallel and mutually insulated by the thickness 7 of the plate 1, by the thickness of the flat wall 5, and by an air gap 8 provided between the wall 5 and the plate 1 (FIG. 3). Accordingly, the plates 3 and 6 form the plates of a parallel-plate capacitor, of which the internal plate will be connected to the mains or network voltage and the other plate will be subjected to touch by a user.

Figure 4:
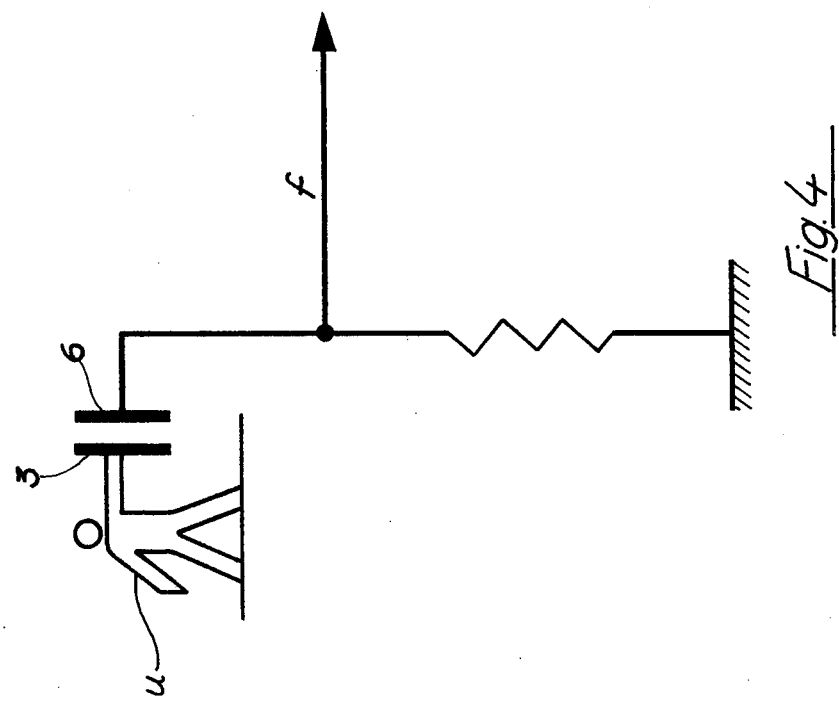
FIG. 4 is a diagrammatic view of the capacitive function of the apparatus.

The capacitative arrangement is more visible from FIG. 4, which shows the capacitor comprising the plates 3 and 6 as forming part of a resistive-capacitive distributor, to which is connected a line $f$ connected in turn to a component of the circuit within the housing 4, the component being arranged to let a signal arriving from the distributor passing therethrough for amplification.

When the user $u$ touches the plate 3 with his hand, the potential on the plate attains or approaches ground potential. A capacitive variation will therefore occur, which is transmitted in the form of a signal to the line $f$. The user, when carrying out this operation, is not subjected to a risk of an electric shock, since the two plates are separate and are very well mutually insulated.

The above illustrated capacitive coupling, in addition to eliminating an electrical connection, will make the entire circuit mechanically independent of the plate 1, since the circuit may be integrally enclosed within the housing 4 and be connected by means of terminals of any form.

As a result, the housing may enclose a complete unit and, moreover, may constitute a modular element to be mounted interchangeably on the plate either individually or as one of a plurality of units distributed in accordance with a desired modular arrangement. For example, in the case of FIG. 1, an equal number of modular apparatuses may be installed corresponding with each of the plates 2 and 3.

Thus, installation may be carried out in a simple and quick manner, saving both time and the cost of labor.

Mounting of the housing 4 may be carried out in either of two distinct manners. A first technique is to mount either one housing or a plurality of juxtaposed housings directly on the plate 1, the latter being equipped with means for flush-mounting. A second technique is to mount either one housing or a plurality of different juxtaposed housings of an intermediate supporting frame 9, also of an insulating material, which has a large opening 10 through which the flat wall 5 may pass for confronting the rear face of the plate 1.

Figure 2:
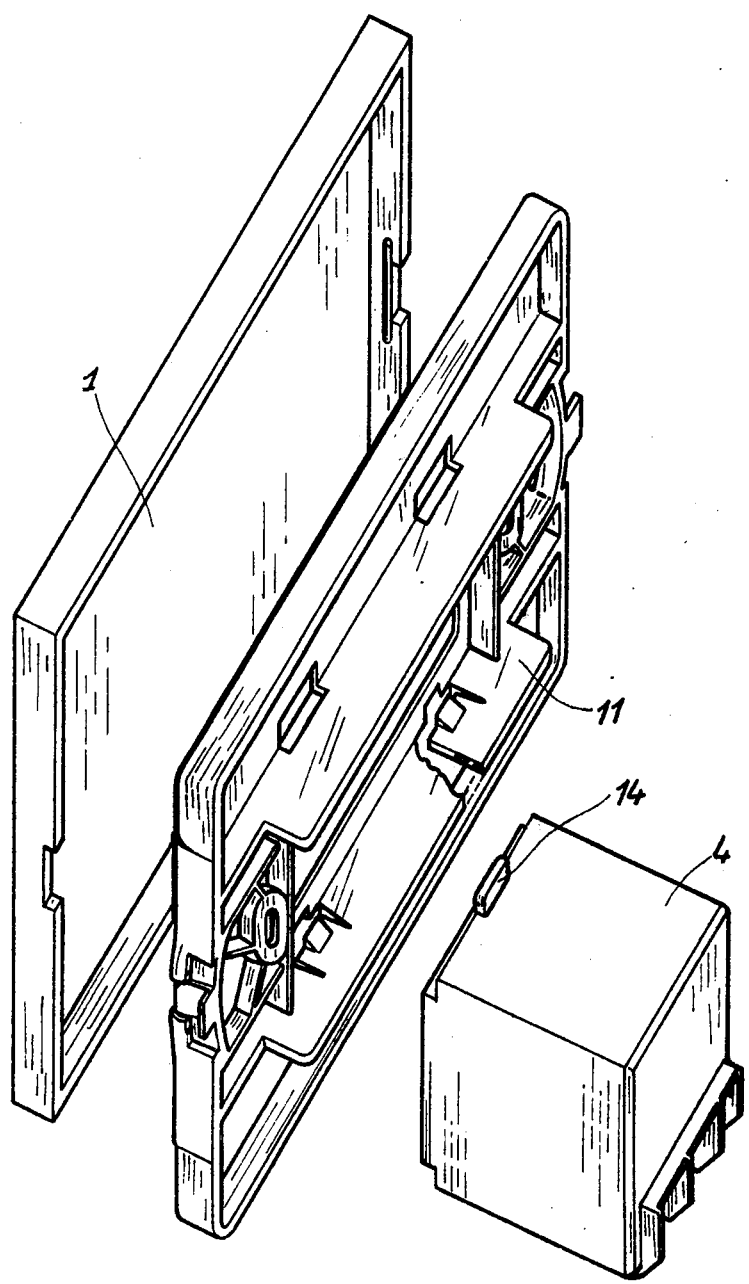
FIG. 2 is an exploded perspective view analogous to FIG. 1 showing another side of the arrangement.

The opening 10 is provided along its upper and lower edges with snap-in means 11, 13 serving to engage lugs 12 and 14, respectivly, projecting from the housing, as more clearing shown in FIGS. 2 and 3.

Naturally, the present invention may be executed in different manners than those described above without departing from its spirit and scope.

I claim:

1. A proximity switch arrangement, comprising a support constituted of electrically-insulating material and having a front and a rear surface; a modular unit having a wall constituted of electrically-insulating material and facing said support; proximity switching means, including actuating means having an electrically-conductive touch plate fixedly mounted at said front surface of said support so as to remain substantially stationary relative to the latter when contacted by a user to thereby generate a signal indicative of such contact, detecting means having an electrically-conductive plate mounted at the inwardly-facing side of said wall which faces away from said support and operative for detecting said signal, and means responsive to said detecting means for initiating transmission of said signal; mounting means for juxtaposing said plates in substantial spaced parallelism by mounting said unit on said supprt, to thereby form a capacitor with the electrically-insulating materials serving as the dielectric, said electrically-insulating materials being operative for maintaining said plates apart and for maintaining said touch plate away from said transmission initiating means to thereby obtain maximum user safety.

2. An arrangement as defined in claim 1, wherein said support comprises a cover member and a frame member, said cover member having a reduced thickness portion formed with a recess in which said touch plate is received.

3. An arrangement as defined in claim 2, wherein said plates are juxtaposed relative to each other at a distance greater than the combined thickness of said reduced thickness portion of said cover member and of said wall of said unit so as to form an air gap intermediate said wall and said cover member.

4. An arrangement as defined in claim 2; and further comprising means for mounting said frame member to said cover member in frictional engagement with each other.

5. An arrangement as defined in claim 2; and further comprising means for mounting said unit to said frame member with snap action.

6. An arrangement as defined in claim 5, wherein said means for mounting said unit to said frame member comprises a pair of lugs spaced on opposite sides of said modular unit, and a pair of recesses formed on said frame member and which receive said lugs with snap action.

7. An arrangement as defined in claim 2, wherein said frame member has an opening adapted to receive said wall of said unit; and further comprising an additional modular unit receivable in said opening together with said first-mentioned unit.

* * * * *

UNITED STATES PATENT AND TRADEMARK OFFICE
CERTIFICATE OF CORRECTION

PATENT NO. : 4,045,629

DATED : August 30, 1977

INVENTOR(S) : Alberto Anzani

It is certified that error appears in the above–identified patent and that said Letters Patent are hereby corrected as shown below:

[73] The name of the Assignee should read:

Bassani Ticino S.p.A.

Signed and Sealed this

Thirteenth Day of June 1978

[SEAL]

Attest:

RUTH C. MASON
*Attesting Officer*

DONALD W. BANNER
*Commissioner of Patents and Trademarks*